(12) United States Patent
Yamashita et al.

(10) Patent No.: US 9,412,557 B2
(45) Date of Patent: Aug. 9, 2016

(54) CHARGED PARTICLE BEAM APPARATUS AND PROGRAM

(71) Applicant: Hitachi High-Technologies Corporation, Minato-ku, Tokyo (JP)

(72) Inventors: Mitsugu Yamashita, Tokyo (JP); Tohru Ando, Tokyo (JP); Yayoi Konishi, Tokyo (JP); Shoutarou Tamayama, Tokyo (JP); Naoko Ushio, Tokyo (JP); Masaki Takano, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/647,323

(22) PCT Filed: Nov. 20, 2013

(86) PCT No.: PCT/JP2013/081255
§ 371 (c)(1),
(2) Date: May 26, 2015

(87) PCT Pub. No.: WO2014/084095
PCT Pub. Date: Jun. 5, 2014

(65) Prior Publication Data
US 2015/0325408 A1 Nov. 12, 2015

(30) Foreign Application Priority Data

Nov. 27, 2012 (JP) ................................ 2012-258967

(51) Int. Cl.
*H01J 37/00* (2006.01)
*H01J 37/26* (2006.01)
(Continued)

(52) U.S. Cl.
CPC ............... *H01J 37/265* (2013.01); *G06F 3/048* (2013.01); *H01J 37/147* (2013.01); *H01J 37/20* (2013.01); *H01J 37/22* (2013.01); *H01J 37/28* (2013.01); *H01J 37/304* (2013.01); *H01J 2237/202* (2013.01);
(Continued)

(58) Field of Classification Search
USPC ................................ 250/492.1, 492.2, 492.3
See application file for complete search history.

(56) References Cited

U.S. PATENT DOCUMENTS

2010/0310095 A1 12/2010 Nakao
2011/0246943 A1 10/2011 Fujibayashi

FOREIGN PATENT DOCUMENTS

GB           2 307 383 A    5/1997
JP           9-198224 A     7/1997
(Continued)

OTHER PUBLICATIONS

International Search Report (PCT/ISA/210) dated Dec. 24, 2013, with English translation (four (4) pages).
(Continued)

*Primary Examiner* — Nicole Ippolito
*Assistant Examiner* — Hanway Chang
(74) *Attorney, Agent, or Firm* — Crowell & Moring LLP (57) ABSTRACT

The movement distance of a second adjustment slider 204 is made shorter than that of a first adjustment slider 205 if the first adjustment slider 205 is positioned in a displayed range, except at both ends thereof, of a set value adjustment axis 203 in a first set value adjustment axis display part 202. The first adjustment slider 205 is kept unmoved while the second adjustment slider 204 alone is moved in the direction of one of both ends of the displayed range if the first adjustment slider 205 is positioned at least at the one of both ends of the displayed range of the set value adjustment axis 203 in the first set value adjustment axis display part 202, if the second adjustment slider 204 is also positioned in the displayed range except at the both ends thereof, and if the first adjustment slider 205 is to be selectively operated by a cursor 220. This structure allows coarse and fine adjustments of set values for operation control to be carried out easily and accurately.

16 Claims, 5 Drawing Sheets

(51) Int. Cl.
- *H01J 37/20* (2006.01)
- *H01J 37/147* (2006.01)
- *G06F 3/048* (2013.01)
- *H01J 37/22* (2006.01)
- *H01J 37/28* (2006.01)
- *H01J 37/304* (2006.01)

(52) U.S. Cl.
CPC ... *H01J 2237/248* (2013.01); *H01J 2237/2801* (2013.01)

(56) References Cited

FOREIGN PATENT DOCUMENTS

| | | |
|---|---|---|
| JP | 11-45168 A | 2/1999 |
| JP | 11-296172 A | 10/1999 |
| JP | 11-345061 A | 12/1999 |
| JP | 2007-242432 A | 9/2007 |
| JP | 2010-283719 A | 12/2010 |
| JP | 2012-27815 A | 2/2012 |
| WO | WO 2010/071187 A1 | 6/2010 |

OTHER PUBLICATIONS

Japanese-language Written Opinion (PCT/ISA/237) dated Dec. 24, 2013 (three (3) pages).

Notification of Transmittal of Translation of the International Preliminary Report on Patentability (PCt/IB/338) dated Jun. 11, 2015, and International Preliminary Report on Patentability (PCT/IB/373) dated Jun. 2, 2015 (six (6) pages).

CHARGED PARTICLE BEAM APPARATUS AND PROGRAM

TECHNICAL FIELD

The present invention relates to a charged particle beam apparatus which irradiates a sample with a charged particle beam to obtain an image of the sample and to perform other operations, and a program thereof.

BACKGROUND ART

The charged particle beam apparatus irradiates a target sample with a charged particle beam to observe and analyze the sample. For example, the scanning electron microscope (SEM) and the transmission electron microscope (TEM) generate microscopic images of the target sample based on diverse items of information obtained by irradiating the sample with the charged particle beam. To obtain an image suitable for observing the sample requires fine-tuning various set values regarding the operation of the charged particle beam apparatus.

Also, in many cases, the scanning electron microscope and the transmission electron microscope, as with numerous other devices using a charged particle beam, have a very wide range in which to adjust the set values regarding their operation. It is thus necessary to perform both coarse and fine adjustments of the set values in that wide range.

With regard to adjusting the set values for such a charged particle beam apparatus, Patent Literature 1 (JP-2007-242432-A) discloses, for example, a charged particle beam apparatus including a slider on a graphic user interface having a marker, and a pointing device for operating the marker to move the marker position, the marker being adapted to be moved in position by a user to change the set values of a device constituting at least one control object and attached to the charged particle beam apparatus for the purpose of controlling the latter.

PRIOR ART LITERATURE

Patent Literature

Patent Literature 1: JP-2007-242432-A

SUMMARY OF THE INVENTION

Problem to be Solved by the Invention

In the case of the above-cited prior art apparatus, when the user activates the operation to move the marker position on the slider, the amount of displacement relative to an acquired reference position of the marker is converted by a conversion means into a value changing speed. A command based on the converted value is transmitted to the device at intervals of a fixed time period set on a timer. While the marker position movement operation is being active, the command is updated on the basis of the amount of displacement from the marker reference position obtained repeatedly, before the command is transmitted to the device. This process is continued so that the changing speed of the set value for the device is varied with the amount of displacement from the marker reference position. That is, while the marker position movement operation remains active, the set value for the device is continuously changed. This arrangement makes it difficult to stop the changing set value at a target value, so that the set value needs to be changed repeatedly.

The present invention has been made in view of the above circumstances, and one object of the invention is to provide a charged particle beam apparatus that can accurately perform coarse and fine adjustments of the set value for operation control and a program for implementing such adjustments.

Means for Solving the Problem

In achieving the above object, the present invention provides a charged particle beam apparatus for irradiating a sample with a charged particle beam to generate an image of the sample. The charged particle beam apparatus includes: a display device displaying at least an image display part displaying the image of the sample; a pointing device operating a cursor displayed on a screen of the display device to select and move an object arranged on the screen; a first set value adjustment axis display part arranged along the image display part on the screen of the display device and displaying partially a set value adjustment axis for adjusting at least one set value used to control the charged particle beam apparatus; a first adjustment slider arranged on the set value adjustment axis and adapted to be moved along the set value adjustment axis by the cursor operated with the pointing device; and a second adjustment slider arranged on the set value adjustment axis and positioned thereon in such a manner as to determine the set value. The second adjustment slider is moved along the set value adjustment axis in interlocking relation with the operation of the cursor to move the first adjustment slider. The movement distance of the second adjustment slider is made shorter than that of the first adjustment slider if the first adjustment slider is positioned in a displayed range, except at both ends thereof, of the set value adjustment axis in the first set value adjustment axis display part. The first adjustment slider is kept unmoved while the second adjustment slider alone is moved in the direction of one of the both ends of the displayed range if the first adjustment slider is positioned at least at the one of the both ends of the displayed range of the set value adjustment axis in the first set value adjustment axis display part, if the second adjustment slider is also positioned in the displayed range except at the both ends thereof, and if the first adjustment slider is to be operated in prescribed fashion by the cursor.

Effect of the Invention

According to the present invention, coarse and fine adjustments of the set value for operation control can be made easily and accurately.

MODE FOR CARRYING OUT THE INVENTION

Explained below in detail with reference to the accompanying drawings is a scanning electron microscope as a typical charged particle beam apparatus embodying the present invention.

Figure 1:
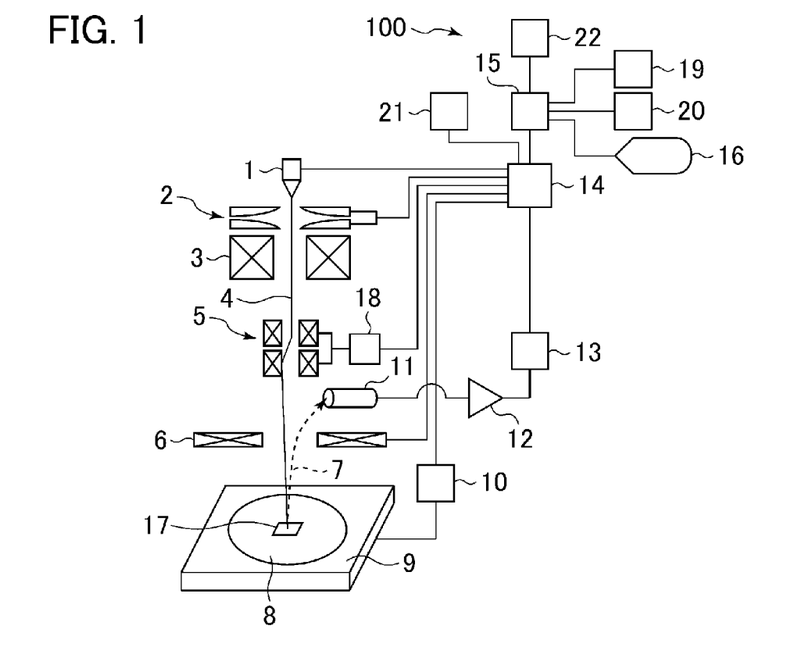
FIG. 1 shows an overall structure of a scanning electron microscope as an embodiment of the present invention.

FIG. 1 shows an overall structure of the scanning electron microscope as one embodiment of the present invention.

In FIG. 1, the scanning electron microscope (SEM) is mainly composed of an electron gun 1, an anode 2, a condenser lens 3, a deflector 5, an objective lens 6, a sample stage 9, a secondary electron detector 11, and a control part 100 that includes a main control part 14 and a computer part 15. The electron gun 1, anode 2, condenser lens 3, deflector 5, objective lens 6, sample stage 9, and secondary electron detector 11 are housed in a sample chamber, not shown, and are controlled individually in operation by the main control part 14 of the control part 100.

The electron gun 1 emits an electron beam (primary electron beam) 4 with which to irradiate a sample 17 as the observation target. The primary electron beam 4 emitted from the electron gun in the direction of the sample 17 is accelerated by the anode 2 and condensed by the condenser lens 3 before reaching the deflector 5. Past the deflector 5, the electron beam is further focused by the objective lens 6 and directed to the sample 17 arranged on a sample platform 8 of the sample stage 9.

The sample stage 9 has a stage control part 10 that controls the operation of the sample stage 9 on the basis of control signals from the main control part 14. The sample stage 9 is adapted to be moved back and forth, right and left, and up and down by a driving device (not shown) controlled by the stage control part 10. Thus moved, the sample stage 9 can position the sample 17 as desired that is placed on the sample platform 8.

The deflector 5 has a deflection control part 18 that controls a deflecting current supplied to the deflector 5 on the basis of control signals from the main control part 14. The deflector 5 scans the sample surface two-dimensionally by having the primary electron beam 4 deflected by action of the deflecting current supplied from the deflection control part 18.

The secondary electron detector 11 is equipped with an amplifier 12 that amplifies a detection signal, and an image storage part 13 that stores the amplified detection signal while also sending it to the main control part 14. Secondary electrons 7 stemming from the scanning of the sample 17 with the primary electron beam 4 are detected by the secondary electron detector 11 and that signals thus detected are sent to the main control part 14 accordingly. The main control part 14 generates an image of the sample 17 by synchronizing the control signal controlling the deflector 5 with the detection signal from the secondary electron detector 11.

The control part 100 includes the main control part 14 that controls the overall operation of the scanning electron microscope, the computer part 15 (e.g., PC) that allows an operator (user) to make various settings and perform other operations, and a dedicated operation panel 21.

The computer part 15 is equipped with an operation/input device such as a mouse 19 and a keyboard 20, a storage part 22 (e.g., hard disk drive) that stores various programs used for operation control of the scanning electron microscope and diverse data such as generated sample images, and a display part 16 (e.g., LCD monitor) that displays setting screens and generated sample images, among others.

The mouse 19, keyboard 20, and a value setting screen 200 on the display part 16 (see FIG. 3 and other drawings, to be discussed later) make up a GUI (graphic user interface) for operating the scanning electron microscope. The mouse 19 serves as a pointing device for operating an on-screen cursor 220 displayed for such operations as selection and movement of an object appearing on the screen of the display part 16 (display device).

The programs stored in the storage part 22 are purpose-oriented programs including a program for executing a value setting part display process (to be discussed later) to set values used for operation control through the use of the GUI, a program for scanning the sample 17 with the primary electron beam 4 and for detecting the secondary electrons 7, and a program for generating an image of the sample 17 from the detection signal.

Incidentally, the programs relevant to this embodiment include not only those that can be executed directly by the computer (e.g., PC) but also those that can be executed when installed on a hard disk or the like. The programs also include those that are compressed or encrypted.

Figure 2:
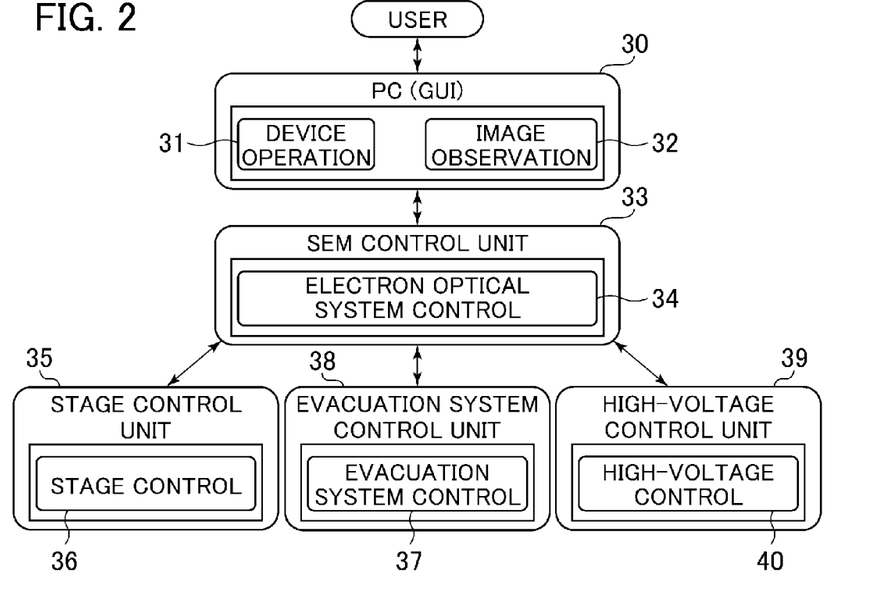
FIG. 2 schematically shows a basic structure of the processing functions of a control part.

FIG. 2 schematically shows a basic structure of the processing functions of the control part.

As shown in FIG. 2, the control part 100 is mainly composed of: an interface function part 30 that allows a device operation process 31 and an image observation process 32 to be carried out on the scanning electron microscope SEM) by a user (operator) operating the mouse 19 and keyboard 20 of the computer part 15 (e.g., PC) or using the GUI (graphical user interface) including various screens of the display part 16; an SEM control unit function part 33 that performs processes regarding overall operation control of the SEM; a stage control unit function part 35 that performs a stage control process 36 regarding the operation of the sample stage 9 in conjunction with the processing carried out by the SEM control unit control part 33; an evacuation system control unit function part 37 that performs an evacuation system control process 38 regarding the evacuation of the sample chamber (not shown); and a high-voltage control unit function part 39 that performs a high-voltage control process 40 regarding the irradiation and scanning with the primary electron beam 4.

Figure 3:
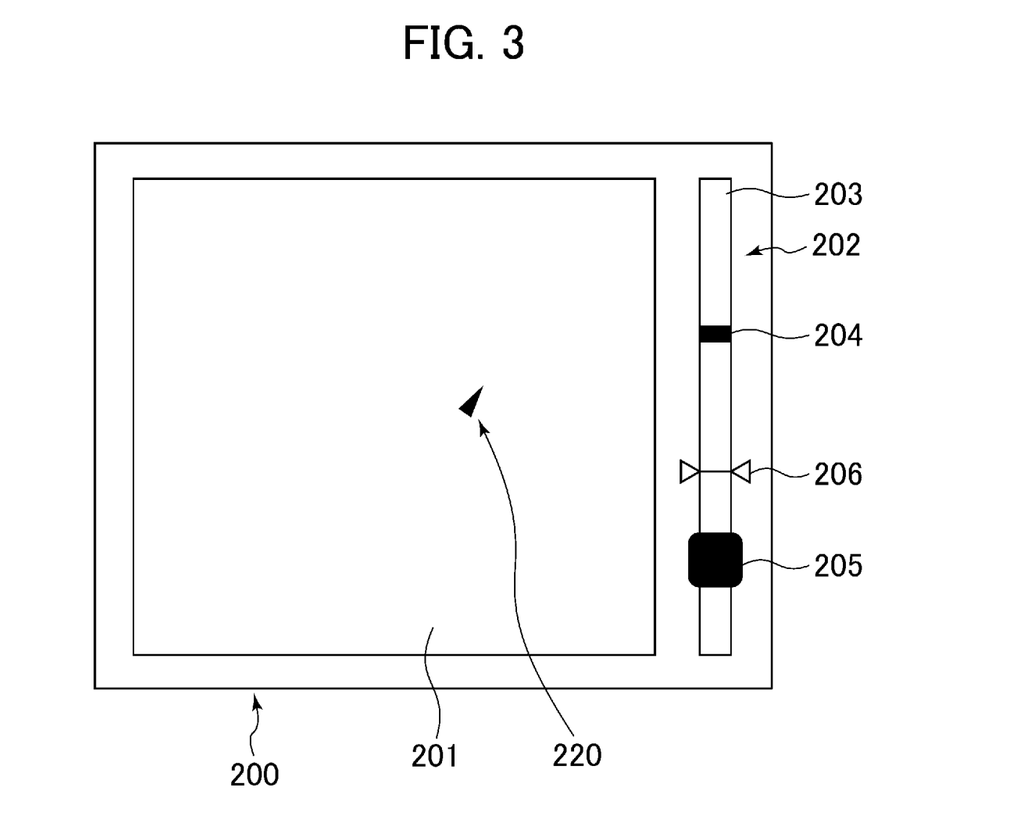
FIG. 3 shows a value setting screen on which various values are set for operation control by a computer part of the scanning electron microscope.
Figure 4:
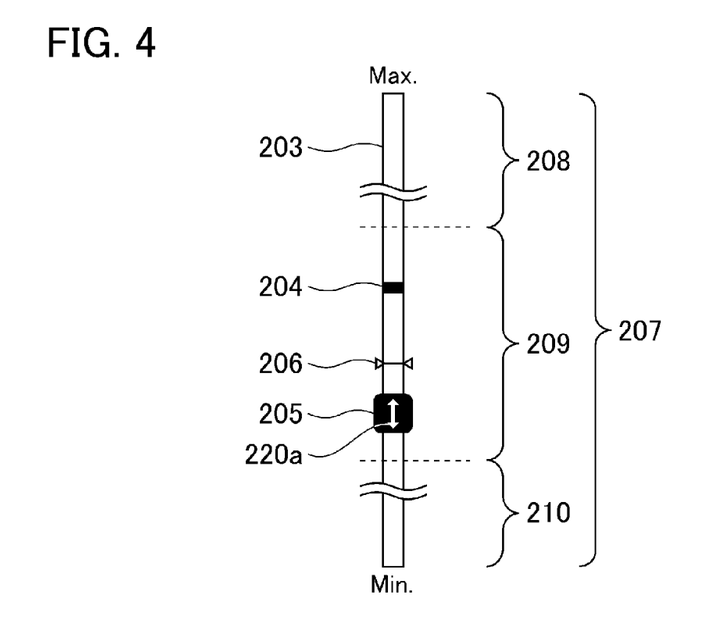
FIG. 4 shows a set value adjustment axis in its entirety.
Figure 5:
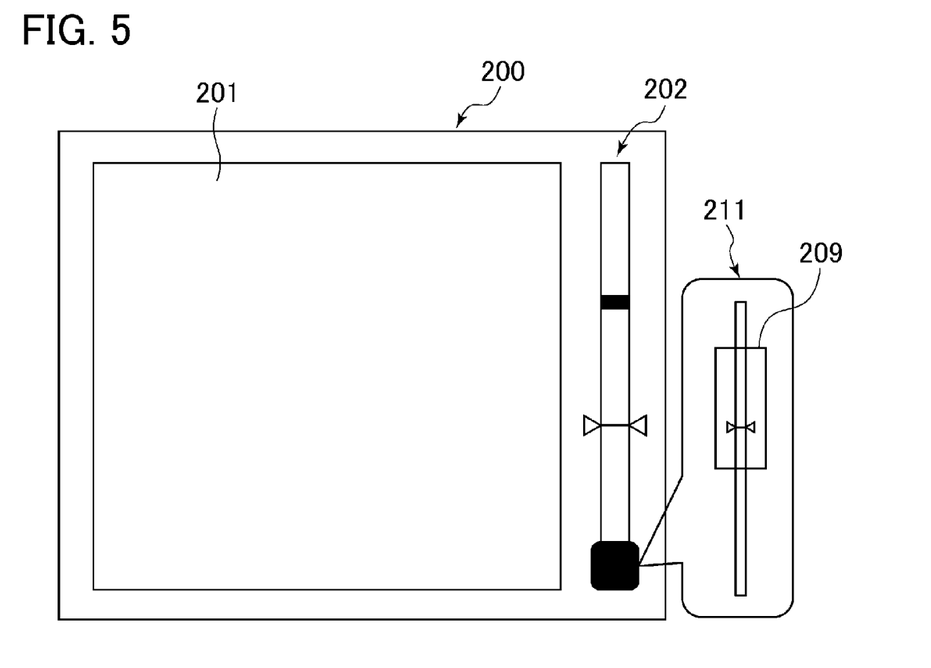
FIG. 5 shows how a second set value adjustment axis display part is displayed.

FIG. 3 shows a value setting screen on which various values are set for operation control by the computer part of the scanning electron microscope. FIG. 4 shows a set value adjustment axis in its entirety. FIG. 5 shows how a second set value adjustment axis display part is displayed.

In FIG. 3, the value setting screen 200 displayed on the display part 16 includes: an image display part 201 that displays a generated image of the sample; a first set value adjustment axis display part 202 arranged along the image display part 201 on the screen of the display part 16 and displaying partially a set value adjustment axis 203 (see range 209, to be discussed later) for adjusting at least one set value used to control the scanning electron microscope; a first adjustment slider 205 arranged on the set value adjustment axis 203 and adapted to be moved along the set value adjustment axis 203 by a cursor 220 operated with the mouse 19; and a second adjustment slider 204 arranged on the set value adjustment axis 203 and positioned thereon in such a manner as to determine the set value. On the set value adjustment axis 203, there is provided a prescribed value setting part 206 indicating the position of a prescribed set value (e.g., standard value). The second adjustment slider 204 is adapted to be moved along the set value adjustment axis 203 by the cursor 220. When the first and the second adjustment sliders 205 and 204 are being selected, the cursor 220 is turned into a shape indicating that it can be moved up and down (see cursor 220a in FIG. 4).

The values set by the position of the second adjustment slider 204 on the set value adjustment axis 203 include focus (focal point), magnification, brightness (luminance), contrast (brightness difference), astigmatism X (X-axis direction astigmatism), and astigmatism Y (Y-axis direct on astigmatism). Switching to the adjustment of a desired set value is achieved using the cursor 220 to select suitable selection buttons of a set value switching part (not shown).

The generated image of the sample 17 is displayed on the image display part 201. A desired image can be obtained by adjusting the set value while the appearance of the image is being verified.

As shown in FIG. 4, the set value adjustment axis 203 has, at its both ends, a predetermined maximum value and a predetermined minimum value of the set value being targeted. The target set value is established by the relative position of the second adjustment slider 204 on the set value adjustment axis 203 in the axial direction thereof. In addition to that range 209 of the set value adjustment axis 203 which is displayed in the first set value adjustment axis display part 202 on the value setting screen 200, there are provided a range 208 not displayed and whose values are higher than those of the displayed range 209 (maximum value side) and a range 210 not displayed and whose values are lower than those of the displayed range 209 (minimum value side). It should be noted that if the maximum or minimum value of the set value adjustment axis 203 is included in the range displayed in the first set value adjustment axis display part 202, the undisplayed range 208 or 210 may not be provided.

The computer part 15 performs the value setting part display process described below by use of the program designed to set values for use in operation control through the GUI.

When the first adjustment slider 205 is selected by the cursor 220 and moved along the set value adjustment axis 203, the second adjustment slider 204 is moved in interlocking relation with the movement of the first adjustment slider 205 along the set value adjustment axis 203 in the same direction as the first adjustment slider 205. If the first adjustment slider 205 is positioned in the displayed range, except at both ends thereof, of the set value adjustment axis 203 in the first set value adjustment axis display part 202, the movement distance of the second adjustment slider 204 is made shorter than that of the first adjustment slider 205. That is, the movement distance of the second adjustment slider 204 on the set value adjustment axis 203 (i.e., amount of change in the set value) is controlled to be shorter than the movement distance of the first adjustment slider 205.

For example, suppose that on the set value adjustment axis 203 represented by a length of 600 pixels on the value setting screen 200 of the display part 16, a value that can range from 0 (minimum value) to 60,000 (maximum value) is adjusted. In that case, a movement of the second adjustment slider by one pixel changes the value by 100. If the first adjustment slider 205 is moved upward (to the maximum value side) by X pixels, the second adjustment slider 204 is moved upward by Y pixels (Y<X). Depending on the movement distance of the second adjustment slider 204 relative to that of the first adjustment slider 205, the movement distance of the second adjustment slider 204 may be less than one pixel mathematically. In practice, the set value is changed exactly by the amount corresponding to the movement distance of the second adjustment slider 204 calculated from the movement distance of the first adjustment slider 205.

Suppose also that the first adjustment slider 205 is positioned at least at one of both ends of the displayed range of the set value adjustment axis 203 in the first set value adjustment axis display part 202, that the second adjustment slider 204 is positioned except at both ends of the displayed range, and that the first adjustment slider 205 is to be moved by the cursor 220 toward one end of the set value adjustment axis 203, i.e., that the first adjustment slider 205 is operated with the cursor 220 to be moved outside of the ends of the set value adjustment axis 203. In that case, the first adjustment slider 205 is kept unmoved at the end position, and only the second adjustment slider 204 is moved in the same direction as the cursor operation. At this point, the movement distance of the second adjustment slider 204 is not dependent on the movement distance of the first adjustment slider 205.

Suppose further that the first adjustment slider 205 is positioned at least at one of both ends of the displayed range of the set value adjustment axis 203 in the first set value adjustment axis display part 202, and that the second adjustment slider 204 is moved to a predetermined position in the first set value adjustment axis display part 202 (e.g., to the same position as the first adjustment slider 205, or to within a prescribed range of distance viewed from the first adjustment slider 205). In that case, the displayed range of the set value adjustment axis 203 in the first set value adjustment axis display part 202 (range 209 in FIG. 4) is relatively moved in the direction of either end in keeping with the movement of the second adjustment slider. For example, if the first adjustment slider 205 and the second adjustment slider 204 are positioned at the upper end in the first set value adjustment axis display part 202, the displayed range of the set value adjustment axis 203 in the first set value adjustment axis display part 202 is moved toward the range 208 shown in FIG. 4.

As described, when the first adjustment slider 205 is positioned at least at one of both ends of the displayed range of the set value adjustment axis 203 in the first set value adjustment axis display part 202 and when the second adjustment slider 204 is moved to a predetermined position in the first set value adjustment axis display part 202, a second set value adjustment axis display part 211 (see FIG. 5) showing the set value adjustment axis 203 in its entirety and the position of the second adjustment slider 204 on the set value adjustment axis 203 is displayed alongside of the first set value adjustment axis display part 202.

Alternatively, when the first adjustment slider 205 is positioned at least at one of both ends of the displayed range of the set value adjustment axis 203 in the first set value adjustment axis display part 202 and when the second adjustment slider 204 is moved to the predetermined position in the first set value adjustment axis display part 202 (e.g., to the same position as the first adjustment slider 205, or to within the prescribed range of distance viewed from the first adjustment slider 205), the displayed range (range 209 in FIG. 4) of the set value adjustment axis 203 in the first set value adjustment axis display part 202 may be switched to display a side of the one end side that includes the position of the second adjustment slider 204. For example, if the first adjustment slider 205 and the second adjustment slider 204 are positioned at the upper end in the first set value adjustment axis display part 202, the displayed range of the set value adjustment axis 203 in the first set value adjustment axis display part 202 may be switched to include the upper end of the range 209 and part or all of the range 208 shown in FIG. 4. In this case, at the time of switching the range of the set value adjustment axis 203, the second set value adjustment axis display part 211 (see FIG. 5) is displayed alongside of the first set value adjustment axis display part 202.

When the first adjustment slider 205 is positioned at least at one end of the displayed range of the set value adjustment axis 203 in the first set value adjustment axis display part 202 and when the second adjustment slider 204 is moved to the predetermined position in the first set value adjustment axis display part 202, an indication to that effect is displayed on the display part 16.

If the first adjustment slider 205 is selected by the cursor 220 and moved along the set value adjustment axis 203, the second adjustment slider 204 is moved in interlocking relation with the movement of the first adjustment slider 205 along the set value adjustment axis 203 in the same direction as the movement of the first adjustment slider 205. If the first adjustment slider 205 is positioned in the displayed range, except at both ends thereof, of the set value adjustment axis 203 in the first set value adjustment axis display part 202, the movement distance of the second adjustment slider 204 is made shorter than that of the first adjustment slider 205. That is, the movement distance of the second adjustment slider 204 on the set value adjustment axis 203 (i.e., the amount of change in the set value) is controlled to be shorter than the movement distance of the first adjustment slider 205.

When the second adjustment slider 204 is operated by the cursor 220, at least the first adjustment slider 205 is controlled to be moved to the center of the first set value adjustment axis display part 202.

The prescribed value setting part 206 is arranged on the set value adjustment axis 203. When the prescribed value setting part 206 is selectively operated by the cursor 220, the first and the second adjustment sliders 205 and 204 are controlled to be moved to prescribed set values on the set value adjustment axis 203 (e.g., to prescribed positions of the prescribed value setting part 206).

When the prescribed value setting part 206 is selectively operated by the cursor 220, the control part 15 moves the first and the second adjustment sliders 205 and 204 to the prescribed set value on the set value adjustment axis 203 (here, to the position of the prescribed value setting part 206 on the set value adjustment axis 203).

Figure 6:
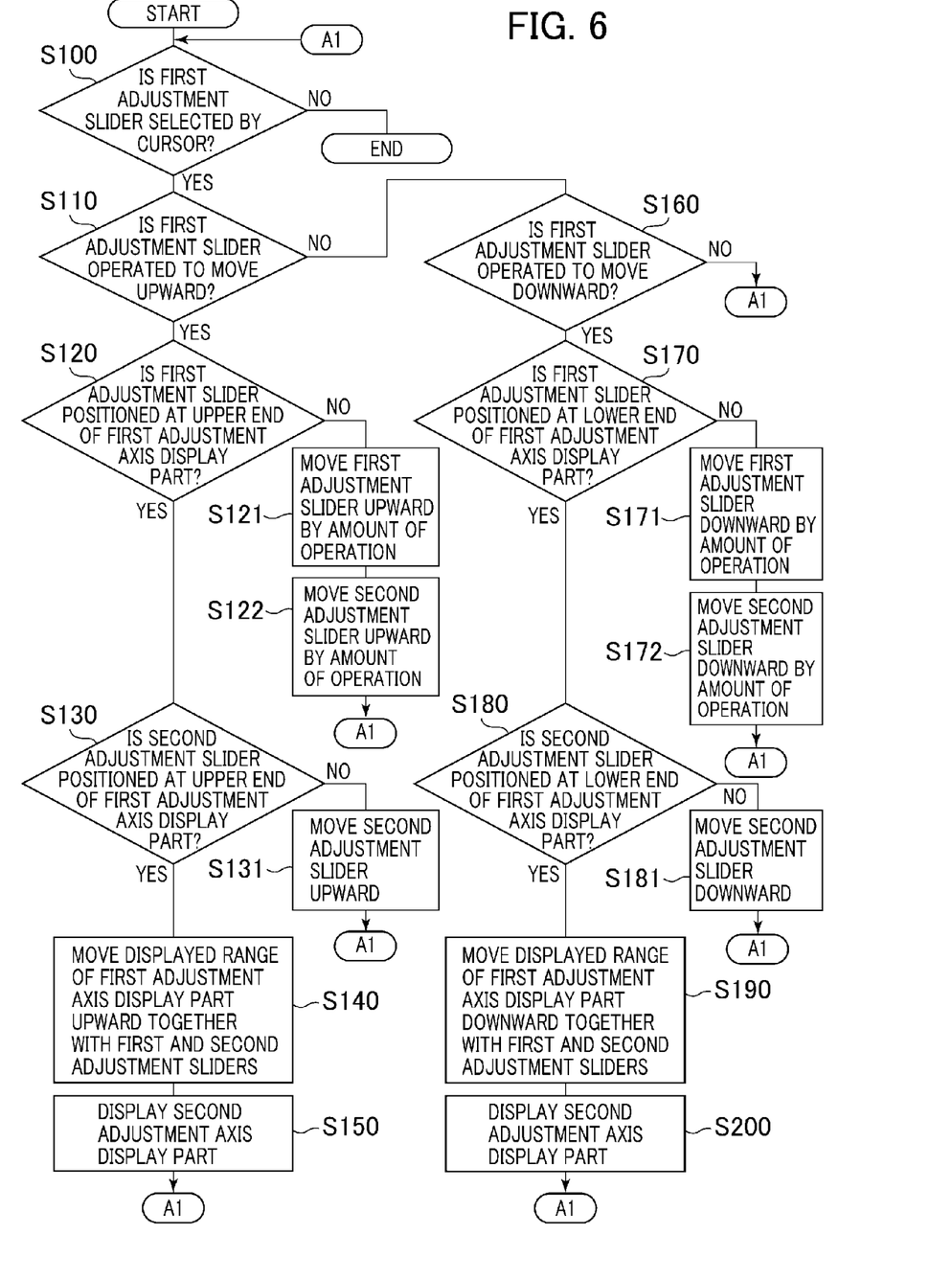
FIG. 6 is a flowchart showing details of a value setting part display process performed by the computer part when a first adjustment slider is selected with a cursor.
Figure 7:
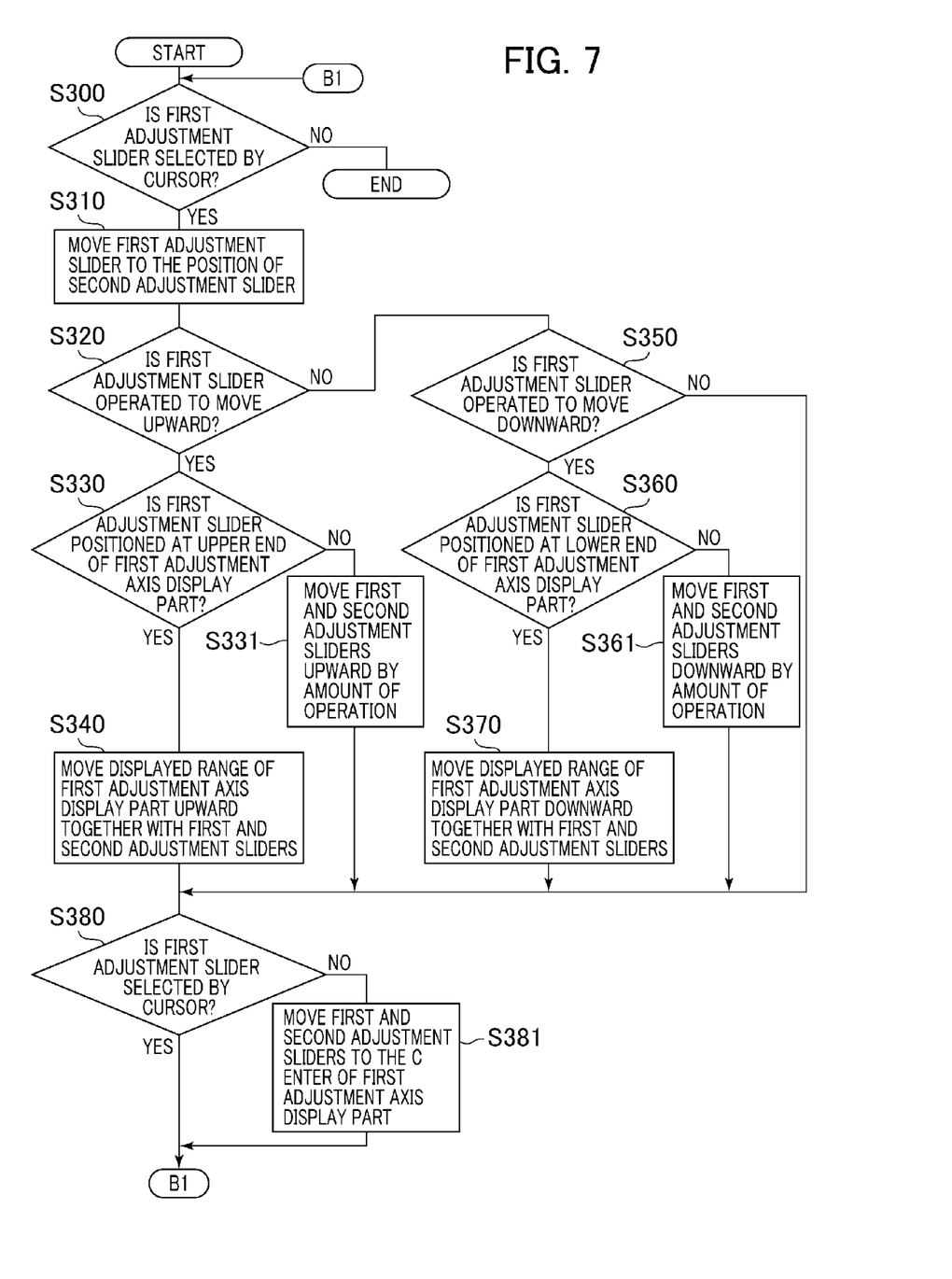
FIG. 7 is a flowchart showing details of the value setting part display process performed by the computer part when a second adjustment slider is selected with the cursor.

Explained below by use of FIGS. 6 and 7 are details of the procedure performed by the computer part using the program of the value setting part display process.

FIG. 6 is a flowchart showing details of the value setting part display process carried out by the computer part when the first adjustment slider is selected by the cursor.

The computer part 15 first determines whether the first adjustment slider 205 is selected by the cursor 220 operated with the mouse 19 (step S100). If the result of the determination is "No," the process is terminated. If the result of the determination is "Yes," it is determined whether the first adjustment slider 205 is operated to move upward (maximum value side) by the cursor 220 (step S110).

If the result of the determination in step S110 is "Yes," it is determined whether the first adjustment slider 205 is positioned at the upper end of the first set value adjustment axis display part 202 (step S120). If the result of the determination in step S120 is "No," the first adjustment slider 205 is moved upward (maximum value side) by the amount corresponding to the operation of the cursor 220 (step S121), and the second adjustment slider 204 is moved in keeping with the amount of movement of the first adjustment slider 205 (step S122). Control is then returned to A1 and step S100 is reached.

If the result of the determination in step S120 is "Yes," it is determined whether the second adjustment slider 204 is positioned at the upper end of the first set value adjustment axis display part 202 (step S130). If the result of the determination is "No," only the second adjustment slider 204 is moved upward (maximum value side) (step S131). Control is then returned to A1 and step S100 is reached. If the result of the determination in step S130 is "Yes," the displayed range in the first set value adjustment axis display part 202 is moved upward (maximum value side) together with the first adjustment slider 205 and the second adjustment slider 204 (step S140), and the second set value adjustment axis display part 211 is displayed (step S150). Control is then returned to A1 and step S100 is reached.

If the result of the determination in step S110 is "No," it is determined whether the first adjustment slider 205 is operated to move downward (minimum value side) by operation of the cursor 220 (step S160).

If the result of the determination in step S160 is "No," control is returned to A1 and step S100 is reached. If the result of the determination in step S160 is "Yes," it is determined whether the first adjustment slider 205 is positioned at the lower end of the first set value adjustment axis display part 202 (step S170). If the result of the determination in step S170 is "No," the first adjustment slider 205 is moved downward (minimum value side) by the amount corresponding to the operation of the cursor 220 (step S171), and the second adjustment slider 204 is moved in keeping with the amount of movement of the first adjustment slider 205 (step S172). Control is then returned to A1 and step S100 is reached.

If the result of the determination in step S170 is "Yes," it is determined whether the second adjustment slider 204 is positioned at the lower end of the first set value adjustment axis display part 202 (step S180). If the result of the determination is "No," only the second adjustment slider 204 is moved downward (minimum value side) (step S181). Control is then returned to A1 and step S100 is reached. If the result of the determination in step S180 is "Yes," the displayed range in the first set value adjustment axis display part 202 is moved downward (minimum value side) together with the first adjustment slider 205 and the second adjustment slider 204 (step S190), and the second set value adjustment axis display part 211 is displayed (step S200). Control is then returned to A1 and step S100 is reached.

FIG. 7 is a flowchart showing details of the value setting part display process performed by the computer part when the second adjustment slider is selected with the cursor.

The computer part 15 first determines whether the second adjustment slider 204 is selected by the cursor 220 operated with the mouse 19 (step S300). If the result of the determination is "No," the process is terminated. If the result of the determination is "Yes," the first adjustment slider 205 is moved to the position of the second adjustment slider 204 (step S310).

It is then determined whether the second adjustment slider 204 is operated to move upward (maximum value side) (step S320). If the result of the determination is "Yes," it is determined whether the second adjustment slider 204 is positioned at the upper end of the first set value adjustment axis display part 202 (step S330). If the result of the determination in step S330 is "Yes," the displayed range in the first set value adjustment axis display part 202 is moved upward together with the first and the second adjustment sliders 205 and 204 (step S340). Control is then transferred to step S380. If the result of the determination in step S330 is "No," the first and the second adjustment sliders 205 and 204 are moved by the amount of the operation (step S331). Control is then transferred to step S380.

If the result of the determination in step S320 is "No," it is determined whether the second adjustment slider 204 is operated to move downward (minimum value side) (step S350). If the result of the determination is "Yes," it is determined whether the second adjustment slider 204 is positioned at the lower end of the first set value adjustment axis display part 202 (step S360). If the result of the determination in step S360 is "Yes," the displayed range in the first set value adjustment axis display part 202 is moved downward together with the first and the second adjustment sliders 205 and 204 (step S370), and control is transferred to step S380. If the result of the determination in step S360 is "No," the first and the second adjustment sliders 205 and 204 are moved downward by the amount of the operation (step S361), and control is transferred to step S380. If the result of the determination in step S350 is "No," control is transferred to step S380.

In step S380, it is determined whether the first adjustment slider 205 is selected by the cursor 220 (step S380). If the result of the determination is "Yes," control is returned to B1 and step S300 is reached. If the result of the determination in step S380 is "No," the first and the second adjustment sliders 205 and 204 are moved to the center of the first set value adjustment axis display part 202 (step S381). Control is then returned to B1 and step S300 is reached.

The effects of the embodiment structured as described above are explained below.

In the prior art, there is known the charged particle beam apparatus including a slider on a graphic user interface having a marker, and a pointing device for operating the marker to move the marker position, the marker being adapted to be moved in position by a user to change set values of a device constituting at least one control object and attached to the charged particle beam apparatus for the purpose of controlling the latter.

In the case of the above-cited prior art apparatus, when the user activates the operation to move the marker position on the slider, the amount of displacement relative to an acquired reference position of the marker is converted by a conversion means into a value changing speed. A command based on the converted value is transmitted to the device at intervals of a fixed time period set on a timer. While the marker position movement operation is being active, the command is updated on the basis of the amount of displacement from the marker reference position obtained repeatedly, before the command is transmitted to the device. This process is continued so that the changing speed of the set value for the device is varied with the amount of displacement from the marker reference position.

However, the prior art apparatus cited above has the following problem:

That is, the prior art apparatus is structured so that the set value for the device is continuously changed as long as the marker position movement operation remains active. In such a case, it is difficult to stop the changing set value the moment it reaches an appropriate value. The fear is that the set value will be changed excessively and that the set value will have to be changed again and again. Particularly in connection with the charged particle beam apparatus such as the scanning electron microscope and the transmission electron microscope, the set value is required to be adjusted in a very minute manner. For these reasons, the above-cited prior art apparatus is not quite suitable for adjusting the set value.

By contrast, this embodiment of the invention is structured to include: the first set value adjustment axis display part arranged along the image display part on the screen of the display device and displaying partially the set value adjustment axis for adjusting at least one set value used to control the charged particle beam apparatus; the first adjustment slider arranged on the set value adjustment axis and adapted to be moved along the set value adjustment axis by the cursor operated with the pointing device; and the second adjustment slider arranged on the set value adjustment axis and positioned thereon in such a manner as to determine the set value, the second adjustment slider being moved along the set value adjustment axis in interlocking relation with the operation of the cursor to move the first adjustment slider. The movement distance of the second adjustment slider is made shorter than that of the first adjustment slider if the first adjustment slider is positioned in the displayed range, except at both ends thereof, of the set value adjustment axis in the first set value adjustment axis display part. The first adjustment slider is kept unmoved while the second adjustment slider alone is moved in the direction of one of the both ends of the displayed range if the first adjustment slider is positioned at least at the one of the both ends of the displayed range of the set value adjustment axis in the first set value adjustment axis display part, if the second adjustment slider is also positioned in the displayed range except at the both ends thereof, and if the first adjustment slider is to be selectively operated by the cursor.

Structured as described above, the embodiment allows coarse and fine adjustments of the set value for operation control to be carried out easily and accurately.

DESCRIPTION OF REFERENCE CHARACTERS

1: Electron gun
2: Anode
3: Condenser lens
4: Primary electron beam
5: Deflector
6: Objective lens
7: Secondary electrons
8: Sample platform
9: Sample stage
10: Stage control part
11: Secondary electron detector
13: Image storage part
14: Main control part
15: Computer part
16: Display part
17: Sample
18: Deflection control part
19: Mouse (pointing device)
20: Keyboard
21: Dedicated operation panel
22: Storage part
100: Control part
200: Value setting screen
201: Image display part
202: First set value adjustment axis display part
203: Set value adjustment axis
204: Second adjustment slider
205: First adjustment slider
206: Prescribed value setting part
211: Second set value adjustment axis display part

The invention claimed is:

1. A charged particle beam apparatus for irradiating a sample with a charged particle beam to generate an image of the sample, the charged particle beam apparatus comprising:
  a display device displaying at least an image display part for displaying the image of the sample;
  a pointing device operating a cursor displayed on a screen of the display device to select and move an object arranged on the screen;
  a first set value adjustment axis display part arranged along the image display part on the screen of the display device and displaying partially a set value adjustment axis for adjusting at least one set value used to control the charged particle beam apparatus;
  a first adjustment slider arranged on the set value adjustment axis and adapted to be moved along the set value adjustment axis by the cursor operated with the pointing device;

a second adjustment slider arranged on the set value adjustment axis and positioned thereon in such a manner as to determine the set value; and a control device for causing the second adjustment slider to move along the set value adjustment axis in interlocking relation with the operation of the cursor to move the first adjustment slider, the control device making the movement distance of the second adjustment slider shorter than that of the first adjustment slider if the first adjustment slider is positioned in a displayed range, except at both ends thereof, of the set value adjustment axis in the first set value adjustment axis display part, the control device keeping the first adjustment slider unmoved while moving the second adjustment slider alone in the direction of one of the both ends of the displayed range if the first adjustment slider is positioned at least at the one of the both ends of the displayed range of the set value adjustment axis in the first set value adjustment axis display part, if the second adjustment slider is also positioned in the displayed range except at the both ends thereof, and if the first adjustment slider is to be selectively operated by the cursor.

2. The charged particle beam apparatus according to claim 1, wherein, if the first adjustment slider is positioned at least at one of the both ends of the displayed range of the set value adjustment axis in the first set value adjustment axis display part and if the second adjustment slider is also moved to reach a predetermined position in the first set value adjustment axis display part, the control device causes the displayed range of the set value adjustment axis in the first set value adjustment axis display part to move relatively in the direction of the one of the both ends of the displayed range in keeping with the movement of the second adjustment slider.

3. The charged particle beam apparatus according to claim 2, wherein, if the first adjustment slider is positioned at least at one of the both ends of the displayed range of the set value adjustment axis in the first set value adjustment axis display part and if the second adjustment slider is also moved to reach a predetermined position in the first set value adjustment axis display part, the control device displays the second set value adjustment axis display part showing the set value adjustment axis as a whole and the position of the second adjustment slider on the set value adjustment axis alongside of the first set value adjustment axis display part.

4. The charged particle beam apparatus according to claim 1, wherein, if the first adjustment slider is positioned at least at one of the both ends of the displayed range of the set value adjustment axis in the first set value adjustment axis display part and if the second adjustment slider is also moved to reach a predetermined position in the first set value adjustment axis display part, the control device switches the displayed range of the set value adjustment axis in the first set value adjustment axis display part to display a side of the one of the both ends, the side including the position of the second adjustment slider.

5. The charged particle beam apparatus according to claim 1, wherein, if the first adjustment slider is positioned at least at one of the both ends of the displayed range of the set value adjustment axis in the first set value adjustment axis display part and if the second adjustment slider is also moved to reach a predetermined position in the first set value adjustment axis display part, the control device displays an indication to that effect.

6. The charged particle beam apparatus according to claim 1, wherein, if the second adjustment slider is operated by the cursor, the control device moves at least the first adjustment slider to the center of the first set value adjustment axis display part.

7. The charged particle beam apparatus according to claim 1, further comprising a prescribed value setting part arranged on the set value adjustment axis;

wherein, if the prescribed value setting part is selectively operated by the cursor, the control device moves the first and the second adjustment sliders to predetermined set values on the set value adjustment axis.

8. A charged particle beam apparatus for irradiating a sample with a charged particle beam to generate an image of the sample, the charged particle beam apparatus comprising:

a display device displaying at least an image display part for displaying the image of the sample;

a pointing device operating a cursor displayed on a screen of the display device to select and move an object arranged on the screen;

a first set value adjustment axis display part arranged along the image display part on the screen of the display device and displaying partially a set value adjustment axis for adjusting at least one set value used to control the charged particle beam apparatus;

a first adjustment slider arranged on the set value adjustment axis and adapted to be moved along the set value adjustment axis by the cursor operated with the pointing device;

a second adjustment slider arranged on the set value adjustment axis and positioned thereon in such a manner as to determine the set value; and a control device for causing the second adjustment slider to move along the set value adjustment axis in interlocking relation with the operation of the cursor to move the first adjustment slider, the control device making the movement distance of the second adjustment slider shorter than that of the first adjustment slider if the first adjustment slider is positioned in a displayed range, except at both ends thereof, of the set value adjustment axis in the first set value adjustment axis display part, the control device keeping the first adjustment slider unmoved while moving the second adjustment slider alone in the direction of one of the both ends of the displayed range if the first adjustment slider is positioned at least at the one of the both ends of the displayed range of the set value adjustment axis in the first set value adjustment axis display part, if the second adjustment slider is also positioned in the displayed range except at the both ends thereof, and if the first adjustment slider is to be moved by the cursor in the direction of the one of the both ends of the set value adjustment axis.

9. A program for a charged particle beam apparatus, the apparatus including: a control device controlling the operation of the charged particle beam apparatus irradiating a sample with a charged particle beam to generate an image of the sample; a display device displaying at least an image display part for displaying the image of the sample; a pointing device operating a cursor displayed on a screen of the display device to select and move an object arranged on the screen; a first set value adjustment axis display part arranged along the image display part on the screen of the display device and displaying partially a set value adjustment axis for adjusting at least one set value used to control the charged particle beam apparatus; a first adjustment slider arranged on the set value adjustment axis and adapted to be moved along the set value adjustment axis by the cursor operated with the pointing device; and a second adjustment slider arranged on the set value adjustment axis and positioned thereon in such a manner as to determine the set value, the program causing the control device to perform the process comprising:

moving the second adjustment slider along the set value adjustment axis in interlocking relation with the operation of the cursor to move the first adjustment slider;

making the movement distance of the second adjustment slider shorter than that of the first adjustment slider if the first adjustment slider is positioned in a displayed range, except at both ends thereof, of the set value adjustment axis in the first set value adjustment axis display part; and keeping the first adjustment slider unmoved while moving the second adjustment slider alone in the direction of one of the both ends of the displayed range if the first adjustment slider is positioned at least at the one of the both ends of the displayed range of the set value adjustment axis in the first set value adjustment axis display part, if the second adjustment slider is also positioned in the displayed range except at the both ends thereof, and if the first adjustment slider is to be selectively operated by the cursor.

10. The program for the charged particle beam apparatus according to claim 9, wherein, if the first adjustment slider is positioned at least at one of the both ends of the displayed range of the set value adjustment axis in the first set value adjustment axis display part and if the second adjustment slider is also moved to reach a predetermined position in the first set value adjustment axis display part, the program causes the control device to move relatively the displayed range of the set value adjustment axis in the first set value adjustment axis display part in the direction of the one of the both ends of the displayed range in keeping with the movement of the second adjustment slider.

11. The program for the charged particle beam apparatus according to claim 10, wherein, if the first adjustment slider is positioned at least at one of the both ends of the displayed range of the set value adjustment axis in the first set value adjustment axis display part and if the second adjustment slider is also moved to reach a predetermined position in the first set value adjustment axis display part, the program causes the display device to display the second set value adjustment axis display part showing the set value adjustment axis as a whole and the position of the second adjustment slider on the set value adjustment axis alongside of the first set value adjustment axis display part.

12. The program for the charged particle beam apparatus according to claim 9, wherein, if the first adjustment slider is positioned at least at one of the both ends of the displayed range of the set value adjustment axis in the first set value adjustment axis display part and if the second adjustment slider is also moved to reach a predetermined position in the first set value adjustment axis display part, the program causes the control device to switch the displayed range of the set value adjustment axis in the first set value adjustment axis display part to display a side of the one of the both ends which includes the position of the second adjustment slider.

13. The program for the charged particle beam apparatus according to claim 9, wherein, if the first adjustment slider is positioned at least at one of the both ends of the displayed range of the set value adjustment axis in the first set value adjustment axis display part and if the second adjustment slider is also moved to reach a predetermined position in the first set value adjustment axis display part, the program causes the control device to display an indication to that effect.

14. The program for the charged particle beam apparatus according to claim 9, wherein, if the second adjustment slider is operated by the cursor, the program causes the control device to move at least the first adjustment slider to the center of the first set value adjustment axis display part.

15. The program for the charged particle beam apparatus according to claim 9, wherein, if a prescribed value setting part arranged on the set value adjustment axis is selectively operated by the cursor, the program causes the control device to move the first and the second adjustment sliders to predetermined set values on the set value adjustment axis.

16. A program for a charged particle beam apparatus, the apparatus including: a control device controlling the operation of the charged particle beam apparatus irradiating a sample with a charged particle beam to generate an image of the sample; a display device displaying at least an image display part for displaying the image of the sample; a pointing device operating a cursor displayed on a screen of the display device to select and move an object arranged on the screen; a first set value adjustment axis display part arranged along the image display part on the screen of the display device and displaying partially a set value adjustment axis for adjusting at least one set value used to control the charged particle beam apparatus; a first adjustment slider arranged on the set value adjustment axis and adapted to be moved along the set value adjustment axis by the cursor operated with the pointing device; and a second adjustment slider arranged on the set value adjustment axis and positioned thereon in such a manner as to determine the set value, the program causing the control device to perform the process comprising:

moving the second adjustment slider along the set value adjustment axis in interlocking relation with the operation of the cursor to move the first adjustment slider;

making the movement distance of the second adjustment slider shorter than that of the first adjustment slider if the first adjustment slider is positioned in a displayed range, except at both ends thereof, of the set value adjustment axis in the first set value adjustment axis display part; and keeping the first adjustment slider unmoved while moving the second adjustment slider alone in the direction of one of the both ends of the displayed range if the first adjustment slider is positioned at least at the one of the both ends of the displayed range of the set value adjustment axis in the first set value adjustment axis display part, if the second adjustment slider is also positioned in the displayed range except at the both ends thereof, and if the first adjustment slider is to be moved by the cursor in the direction of the one of the both ends of the set value adjustment axis.

\* \* \* \* \*